United States Patent
Ellenberger et al.

(10) Patent No.: US 6,417,576 B1
(45) Date of Patent: Jul. 9, 2002

(54) METHOD AND APPARATUS FOR ATTACHING MULTIPLE METAL COMPONENTS TO INTEGRATED CIRCUIT MODULES

(75) Inventors: Ron Ellenberger, San Jose, CA (US); Frank Joseph Juskey, Phoenix; Ronald James Schoonejongen, Chandler, both of AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/884,357

(22) Filed: Jun. 18, 2001

(51) Int. Cl.[7] .............................................. H01L 23/28
(52) U.S. Cl. ...................... 257/787; 257/720; 257/782
(58) Field of Search ............................... 257/787, 778, 257/782, 706, 720, 737, 784; 438/122, 125, 112, 124, 127, 108, 617

(56) References Cited

U.S. PATENT DOCUMENTS 5,986,885 A * 11/1999 Wyland ...................... 257/687
6,247,229 B1 * 6/2001 Glenn ........................ 174/52.2

* cited by examiner

*Primary Examiner*—Hoai Ho
*Assistant Examiner*—Long K. Tran
(74) *Attorney, Agent, or Firm*—Jeffrey D. Moy; Harry M. Weiss; Weiss & Moy, P.C.

(57) ABSTRACT

Apparatus for attaching multiple metal components to integrated circuit modules reduces manufacturing time for module assemblies having metal shields and/or heat sinks that must be applied to multiple modules within a manufacturing assembly. The metal components are manufactured in an array and the array assembly is attached to the integrated circuit substrate. The metal component array is then divided along with the modules after attachment. The modules are sawed apart before or after attachment. A reduction in manufacturing time is achieved through multiple placement of the metal components rather than individual placement.

20 Claims, 4 Drawing Sheets

US 6,417,576 B1

METHOD AND APPARATUS FOR ATTACHING MULTIPLE METAL COMPONENTS TO INTEGRATED CIRCUIT MODULES

FIELD OF THE INVENTION

The present invention relates generally to semiconductor packaging, and more specifically, to a method and apparatus for attaching multiple metal parts to integrated circuit modules.

BACKGROUND OF THE INVENTION

Semiconductors and other electronic and opto-electronic assemblies are fabricated in groups on a wafer. Known as "dies", the individual assemblies are cut from the wafer and are then bonded to a carrier. Typically the carrier is an insulating or conductive substrate, but in some cases the substrate is a printed wiring board (PWB), lead-frame carrier, or other structure suitable for mechanically stabilizing the die.

Telecommunications modules such as cellular telephone radio-frequency (RF) components typically require shielding to prevent electromagnetic interference (EMI) from disrupting or being disrupted by other components within a final assembly. Modern high-frequency semiconductors such as microprocessors and memory devices are sometimes shielded and as operating frequencies increase, the shielding requirements may also increase. Metal shields are placed over the module circuits and bonded to the module, forming an integrated assembly with an integral shield.

Also within telecommunications and high-frequency integrated circuit applications, modules typically require heat sinks to transfer heat away from (and sometimes prevent transfer of heat into) a module. The heat sinks transfer heat more effectively than heat conduction through a substrate alone. The heat sinks are generally metal parts and the above-mentioned M shields may serve a dual purpose as a heat sink and an EMI shield.

Application of the metal parts (EMI shields and/or heat sinks) is typically performed by pick-and-place robotic machines that place each shield or heat sink over circuits mounted on a substrate. The module is encapsulated after the metal parts have been placed. Individual placement is a time-consuming process that may require, for example, one second per metal part to place. With many shields to place on a manufacturing assembly, which may require for example 50 shields, the manufacturing time may be extended on the order of one minute.

Therefore, it would be desirable to provide a method and apparatus for attaching multiple metal parts to integrated circuit modules that does not require individual placement.

SUMMARY OF THE INVENTION

A method and apparatus for attaching multiple metal components to integrated circuit modules reduces manufacturing time for module assemblies having metal shields and/or heat sinks that must be applied to multiple modules within a manufacturing assembly. An array comprising metal components is manufactured and the array is attached to the integrated circuit substrate.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1:
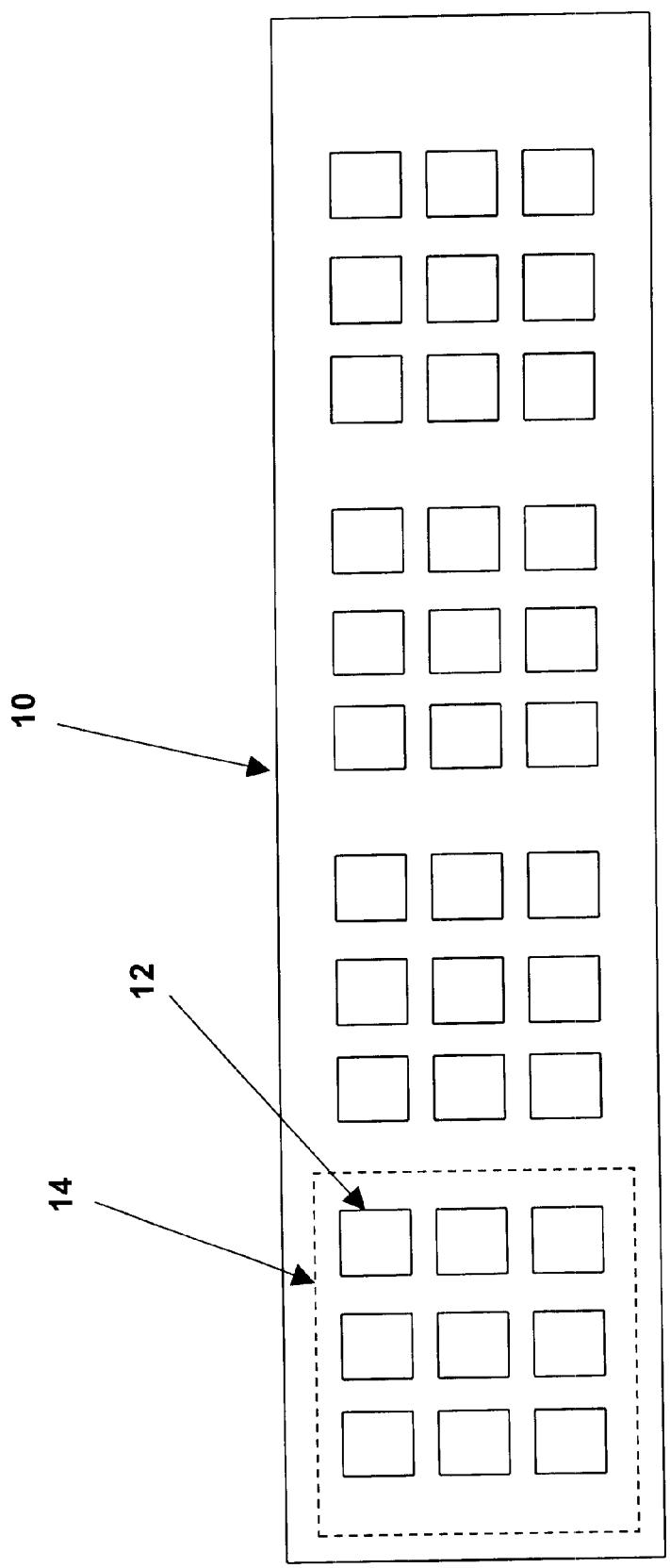
FIG. 1 is a pictorial diagram depicting a top view of a assembly of integrated circuit modules to which an embodiment of the invention may be applied.

Referring now to the figures and in particular to FIG. 1, of a top view of an assembly of integrated circuit modules to which an embodiment of the invention may be applied is depicted. A substrate 10 comprises a mounting structure for manufacture of integrated circuit modules. A plurality of dies 12 is mounted on substrate 10 by an adhesive mechanism such as epoxy or adhesive film. Groups 14 of dies are associated together for manufacturing purposes, such as placement of the dies and for attaching the metal components of the present invention. Substrate 10 may be a printed circuit board (PCB), silicon wafer, aluminum oxide substrate or other suitable mounting structure for integrated circuit dies. Dies 12 may be discrete semiconductors, memory modules, optoelectronic components and other components known to those of ordinary skill in the art of component packaging.

In order to provide electronic and thermal shielding for such devices as telecommunications integrated circuit modules, metal components are attached to substrate 10 over dies 12. The metal components may be heat sinks for conducting heat away from a die, heat shields for reflecting radiated or convected heat away from a die, or electronic shields for preventing electromagnetic interference (EMI) from disrupting operation of the die.

Typically in the prior art, metal components have been placed by pick-and-place machines and temporarily held in place with an epoxy or other adhesive prior to encapsulation of the integrated circuit modules. The present invention applies metal components in a group, using an array of metal components to speed the manufacturing process. Placing one shield at a time may take, for example, one second per metal component placement. Using the illustrative embodiment of FIG. 1 for example, placement may take four seconds to place nine metal components simultaneously, resulting in an assembly time of less than half of that required to place the metal components individually. As the number of metal components per array is increased, the additional assembly time increases only slightly, resulting in a greater savings in assembly time for larger arrays.

The limitations on the improvements provided by increased array size are array size limitations brought about by the capacity of the placement machines used and the mechanical alignment of an array with the substrate and dies. Therefore, the groups 14 of dies 12 provide an arrangement that permits proper alignment, while providing a savings in assembly time over individual placement of dies.

Figure 2:
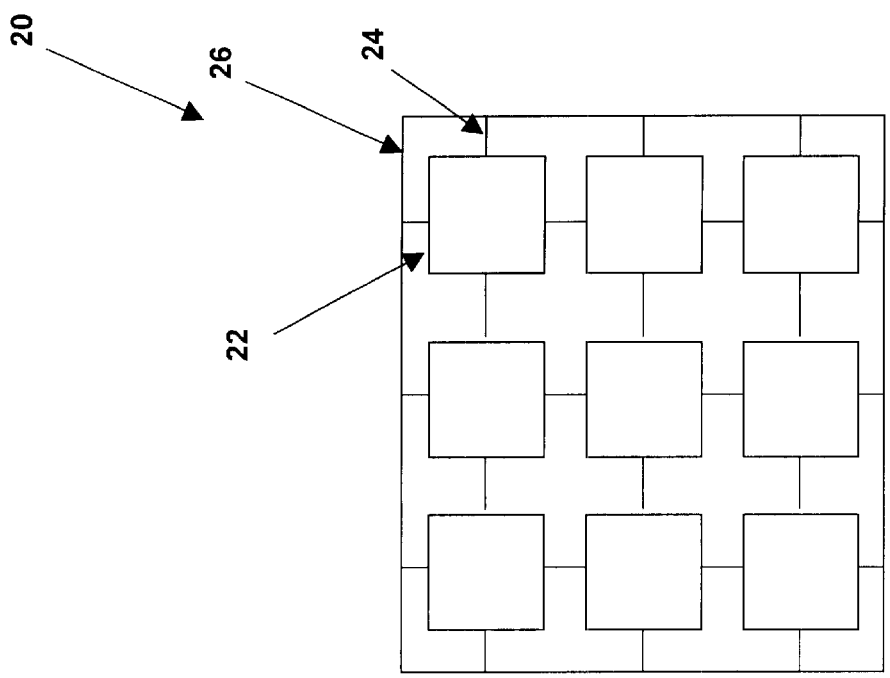
FIG. 2 is a pictorial diagram depicting a top view of a metal component array in accordance with an embodiment of the invention.

Referring now to FIG. 2, a top view of an array of metal components 20 in accordance with an embodiment of the present invention is depicted. A carrier frame 26 holds metal components 22 via tabs 24 that are disposed between metal components 22 and carrier frame 26, forming a rigid mechanical assembly that may be applied over the groups 14 of dies 12 of FIG. 1. Tabs 24 are cut, dividing the metal component array 20 into individual metal components when substrate 10 is sawed to separate the individual dies 12. Encapsulation of the metal components 22, dies 12 and the substrate 10 may be performed to create a mechanically durable assembly. Encapsulation may be performed before or after sawing. It should be understood that the present invention applies to assemblies such as chip-on-board assemblies wherein dies are encapsulated on the PCB, but the metal component is attached subsequently as part of an array. Such assemblies may be desirable to manufacture with the metal component unfilled with encapsulant.

An alternative to sawing all of the tabs may be desirable for thermal or electrical conductivity of the individual metal components. If a multi-die module is being manufactured, it may be desirable to leave the tabs that connect metal components that will be left on a single final assembly. The tabs may provide a thermal and/or electrical coupling between the metal components, improving the performance of the overall shield or heat sink.

Figure 3A:
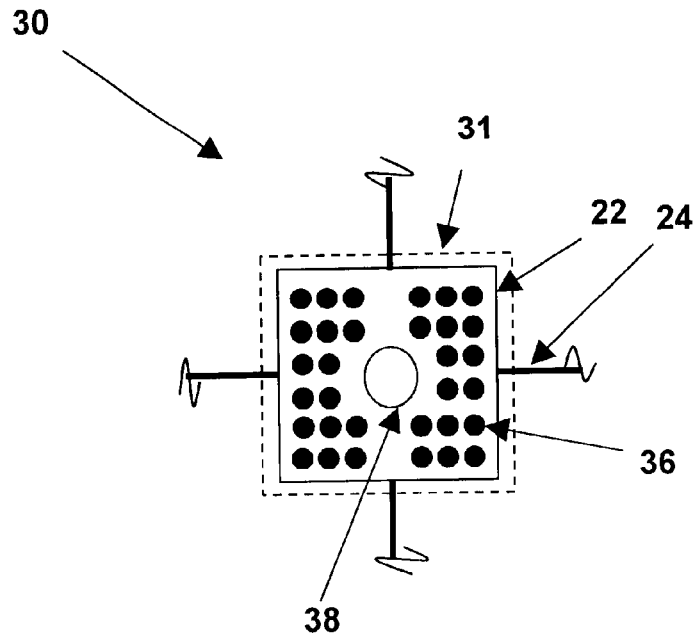
FIG. 3A is a pictorial diagram depicting a top view of an integrated circuit module assembly in accordance with an embodiment of the invention.

Referring now to FIG. 3A, a top view of an integrated M circuit assembly 30 is depicted. Metal component 22 is attached to substrate area 31 over an integrated circuit die (or multiple dies). While the substrate extends beyond the assembly of FIG. 3A, a dashed line shows the saw channel for cutting the integrated circuit assembly 30 from a larger substrate that includes the other assemblies associated with other metal components in the metal component array.

Metal component 22 as depicted is a dual-use component for providing both heat sink and electronic shielding. A dimpled area 38 is produced by indenting the top surface of metal component. The bottom surface of the metal component dimpled area 38 may contact the die, so that heat may be conducted from the die to metal component 22. Apertures 36 are formed in metal component 22, generally by stamping although they may be drilled. Apertures 36 provide a mechanism for introducing encapsulant and permitting the outflow of air or other gas during the encapsulation process. Apertures 36 may alternatively be used in a non-encapsulated assembly permit convection of heat. For both types of assemblies, apertures 36 reduce the weight of the metal shielding. Reduced weight is critical in assemblies for use in portable devices such as cellular telephones or pocket computing devices.

Metal tabs 24 are shown as extending past assembly 30, as the depiction of FIG. 3A shows assembly 30 prior to division by sawing, laser cutting or other separation technique. Metal tabs 24 provide a means for securing metal component 22 within an array of metal components during assembly.

Figure 3B:
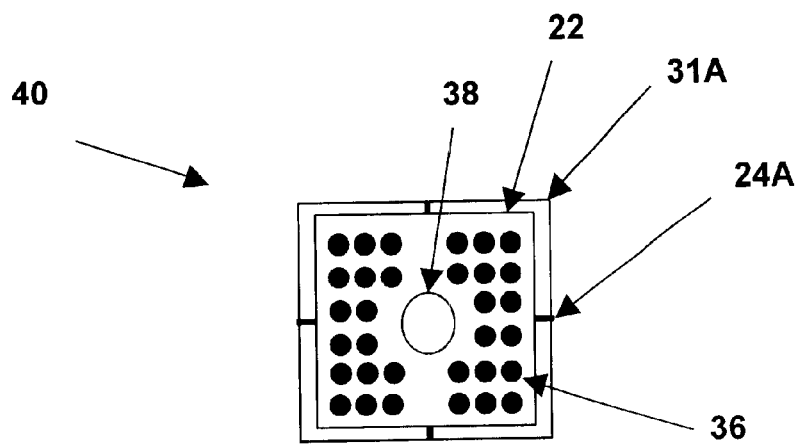
FIG. 3B is a pictorial diagram depicting a top view of a detached integrated circuit module assembly in accordance with an embodiment of the invention.

Referring now to FIG. 3B, a detached integrated circuit assembly 40 in accordance with a preferred embodiment of the invention is depicted. Assembly 40 includes metal component 22 mounted to a cut substrate 31A. Metal component 22 has a dimpled area 38 in contact with the top of a die 12 (not visible) underneath metal component 22. Portions of tabs 24A extend from integrated circuit assembly 40 and may be attached to electrical or thermal connections for enhancing the thermal and electromagnetic shielding performance of metal component 22. An integrated circuit assembly manufactured by the methods of the present invention may be identified by the presence of metal tab portions 24A, whether or not they are used for thermal and electrical connection.

Figure 4A:
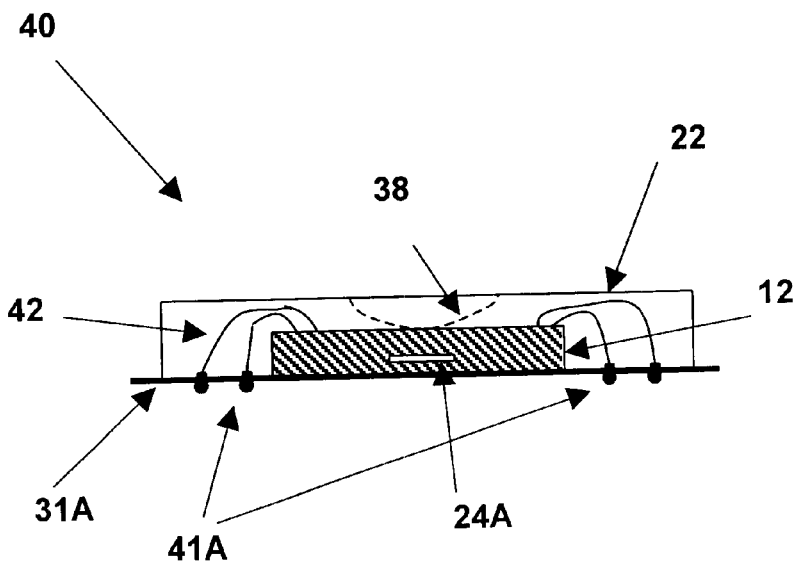
FIG. 4A is a pictorial diagram depicting a side view of a detached integrated circuit module assembly in accordance with an embodiment of the invention.

Referring now to FIG. 4A, a side view of detached integrated circuit assembly 40 is shown. Die 12 mounted on substrate 31A is visible under metal component 22, with a dashed line depicting dimpled area 38 contacting the top of die 12 to provide thermal conduction. Die 12 is coupled to solder ball contacts 41A by wires 42 in a wire-bond attach as is well known in the art of integrated circuit manufacturing. A portion of metal tab 24A is shown protruding from the end of metal component 22, in which the side panel has been removed for illustrative purposes. The portion of metal tab 24A will be visible in a circuit that has been encapsulated and then sawn in accordance with an embodiment of the present invention. The tab may have a different cross section appearance that the illustrative depiction shown in FIG. 4, for example, a cylindrical tab will have a circular cross section. Tab 24A may be attached to a thermal conductive or electrical conductive path for enhancing the thermal or electrical effectiveness of the heatsink or shield.

Electrical connection to integrated circuit assembly 40 is made by a plurality of electrical contacts 41 disposed on the bottom side of substrate 31A. A "flip chip" connection is provided by inserting electrical contacts 41 into mating holes in the system in which integrated circuit assembly 40 is used. Alternatively, wire bonding pads may be disposed on the bottom side of substrate 41 so that wires may be attached after the integrated circuit assembly is complete.

Figure 4B:
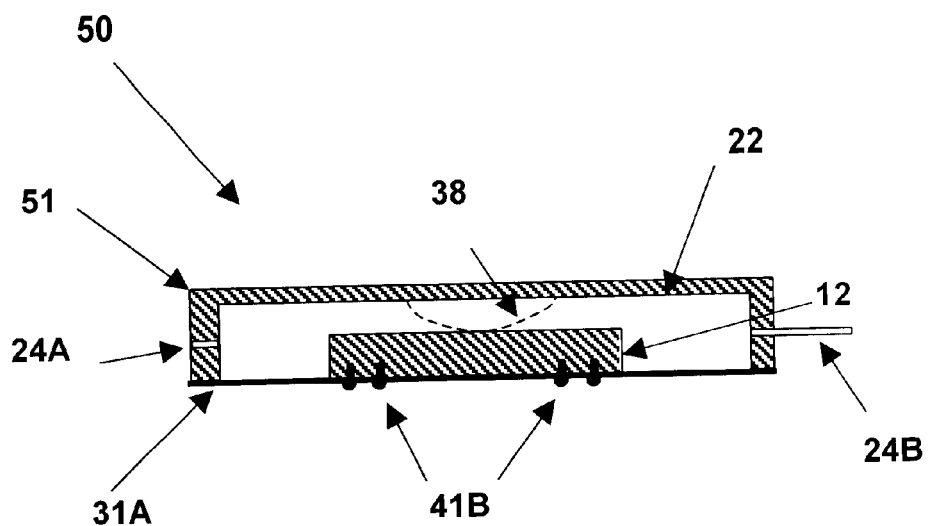
FIG. 4B is a pictorial diagram depicting an end view of a detached integrated circuit module assembly in accordance with an embodiment of the invention.

Referring now to FIG. 4B, an end view of a detached and encapsulated integrated circuit assembly 50 is shown. Die 12 is coupled to solder ball/flip-chip post contacts 41B in a flip-chip attach as is well known in the art of integrated circuit manufacturing. Encapsulant 51 has been applied to the assembly and portions have been removed in order to depict die 12 and metal component 22. A portion of metal tab 24A is shown protruding from the end of metal component 22, in which the side panel has been removed for illustrative purposes. The portion of metal tab 24A internal to the encapsulant (the reentrant portion) will be visible in a circuit that has been encapsulated and then sawn in accordance with an embodiment of the present invention. FIG. 4B further illustrates an uncut tab 24B, that may be used for connection to a thermal conductive or electrical conductive path for enhancing the thermal or electrical effectiveness of metal component 22.

The above description of embodiments of the invention is intended to be illustrative and not limiting. Other embodiments of this invention will be obvious to those skilled in the art in view of the above disclosure and fall within the scope of the present invention.

What is claimed is:

1. A semiconductor assembly, comprising:
   a die;
   a substrate for mounting said die;
   a plurality of electrical terminals attached to said substrate and electrically coupled to connections on said die for providing an electrical interface to said die;
   an encapsulant covering said die and attached to said substrate for covering said die; and
   a metal component disposed over said die and mechanically coupled to said substrate, said metal component having a reentrant metal portion cut from an attachment tab for holding said metal component within an array of metal components during manufacture.

2. The semiconductor assembly of claim 1, wherein said metal component is a heat sink.

3. The semiconductor assembly of claim 2 wherein said reentrant metal portion forms an attachment point for a thermal coupling for conducting heat to or from said heat sink.

4. The semiconductor assembly of claim 1, wherein said metal component is an electromagnetic shield.

5. The semiconductor assembly of claim 4, wherein said reentrant metal portion forms an attachment point for electrical coupling said electromagnetic shield to a circuit.

6. The semiconductor assembly of claim 1, wherein said substrate further comprises a plurality of plated through holes and said metal component further comprises mounting pins for mounting said metal component by inserting said pins through said plated through holes.

7. A semiconductor assembly, comprising:

a die;

a substrate for mounting said die;

a plurality of electrical terminals attached to said substrate and electrically coupled to connections on said die for providing an electrical interface to said die;

an encapsulant covering said die and attached to said substrate for covering said die; and a metal component disposed over said die and mechanically coupled to said substrate; and means for securing said metal component within an array of metal components during manufacture of said semiconductor assembly.

8. The semiconductor assembly of claim 7, wherein said metal component is a heat sink.

9. The semiconductor assembly of claim 8 wherein said means for securing further comprises means for conducting heat to or from said heat sink.

10. The semiconductor assembly of claim 7, wherein said metal component is an electromagnetic shield.

11. The semiconductor assembly of claim 10, wherein said means for securing further comprises means for electrically coupling said electromagnetic shield.

12. The semiconductor assembly of claim 7, wherein said substrate further comprises a plurality of plated through holes and said metal component further comprises mounting pins for mounting said metal component by inserting said pins through said plated through holes.

13. An assembly for attachment to an integrated circuit substrate having a plurality of integrated circuits mounted thereon, said assembly comprising:

a plurality of metal components;

a carrier frame for holding and aligning said metal components; and a plurality of attachment tabs disposed between said metal components for mechanically coupling said metal components to each other and to said carrier frame such that said plurality of metal components forms an array for attachment to said integrated circuit substrate.

14. The assembly of claim 13, wherein said metal components are heat sinks.

15. The assembly of claim 13, wherein said metal components, said carrier frame and said attachment tabs are formed in a contiguous stamped metal assembly.

16. The assembly of claim 13, wherein said metal components further comprise mounting pins for mounting said metal assembly by inserting said pins through plated through holes in a substrate.

17. The assembly of claim 13 wherein the plurality of attachment tabs provide thermal coupling between the plurality of metal components.

18. The assembly of claim 13 wherein the plurality of attachment tabs provide electrical coupling between the plurality of metal components.

19. The assembly of claim 13 further comprising a dimpled area on a top surface of the plurality of metal components wherein the dimpled area is in contact with the integrated circuit substrate to dissipate heat from the integrated circuit substrate to the plurality of metal components.

20. The assembly of claim 13 further comprising an aperture formed in the plurality of metal components to introducing an encapsulate and permitting an outflow of gases during an encapsulation process.

* * * * *